(12) United States Patent
Khalaf (10) Patent No.: US 9,972,610 B2
(45) Date of Patent: May 15, 2018

(54) SYSTEM-IN-PACKAGE LOGIC AND METHOD TO CONTROL AN EXTERNAL PACKAGED MEMORY DEVICE

(71) Applicant: Intel Corporation, Santa Clara, CA (US)

(72) Inventor: Bilal Khalaf, Folsom, CA (US)

(73) Assignee: Intel Corporation, Santa Clara, CA (US)

( * ) Notice: Subject to any disclaimer, the term of this patent is extended or adjusted under 35 U.S.C. 154(b) by 289 days.

(21) Appl. No.: 14/809,132

(22) Filed: Jul. 24, 2015

(65) Prior Publication Data

US 2017/0025400 A1 Jan. 26, 2017

(51) Int. Cl.
*G11C 7/00* (2006.01)
*H01L 25/18* (2006.01)
*H01L 25/00* (2006.01)
*G06F 3/06* (2006.01)

(52) U.S. Cl.
CPC ............ *H01L 25/18* (2013.01); *G06F 3/0604* (2013.01); *G06F 3/0629* (2013.01); *G06F 3/0673* (2013.01); *H01L 25/50* (2013.01); *H01L 2224/16225* (2013.01)

(58) Field of Classification Search
CPC .. G11C 5/04; G11C 5/025; G11C 7/10; G11C 7/105; G11C 2207/104; G11C 7/1003; G11C 7/1012; G11C 7/1069; G11C 8/06; G11C 8/12
USPC .......................................... 365/189.11, 52, 63
See application file for complete search history.

(56) References Cited

U.S. PATENT DOCUMENTS

| | | | | |
|---|---|---|---|---|
| 5,640,361 | A | * | 6/1997 | Hessel ................... G11C 5/066 365/189.02 |
| 7,944,046 | B2 | | 5/2011 | Chao |
| 8,125,838 | B2 | * | 2/2012 | Wang ................... G11C 7/1006 365/189.07 |
| 9,069,714 | B2 | * | 6/2015 | Yu ........................... G06F 13/16 |
| 2012/0319293 | A1 | | 12/2012 | Cheah et al. |
| 2013/0060985 | A1 | | 3/2013 | Yu et al. |

(Continued)

FOREIGN PATENT DOCUMENTS

WO WO-2008076790 6/2008

OTHER PUBLICATIONS

International Search Report and Written Opinion for PCT Patent Application No. PCT/US2016/032901 dated Aug. 31, 2016, 12 pgs.

*Primary Examiner* — Gene Audong
(74) *Attorney, Agent, or Firm* — Compass IP Law PC (57) ABSTRACT

Techniques and mechanisms for a SIP to control access to a non-volatile memory of another packaged device. In an embodiment, the SIP includes interface a processor, a local memory and a memory controller that provides the processor with access to the local memory. The SIP further includes interface hardware to couple the SIP to the packaged device, wherein the processor of the SIP accesses a non-volatile memory of the packaged device via the memory controller of the SIP. In another embodiment, the interface hardware of the SIP includes a first plurality of contacts to couple to the packaged device, as well as a second plurality of contacts. An interface standard describe an arrangement of interface contacts, wherein, of a first arrangement of the first contacts and the second arrangement of the second contacts, only the second arrangement conforms to the described arrangement of interface contacts.

20 Claims, 7 Drawing Sheets

(56) References Cited

U.S. PATENT DOCUMENTS

2014/0047169 A1   2/2014  Seo et al.
2014/0210081 A1   7/2014  Lin et al.
2015/0113356 A1   4/2015  Ken et al.

* cited by examiner

Table 400a

| AC | AB | AA | Y | W | V | U | T | |
|---|---|---|---|---|---|---|---|---|
| DNU | DNU | VSS | | VSS | | VSS | | 1 |
| DNU | DNU | VSS | | VSS | | VSS | | 2 |
| | | VSS | | VSS | | VSS | | 3 |
| DNU | DNU | VSS | PETp3 | VSS | PERp3 | VSS | PETp2 | 4 |
| | | VSS | PETn3 | VSS | PERn3 | VSS | PETn2 | 5 |
| DNU | DNU | DNU | VSS | VSS | | | | 6 |
| | | DNU | DNU | DAS | | V1p8 | V1p8 | 7 |
| DNU | DNU | DNU | DNU | RFU | | V1p8 | V1p8 | 8 |
| | | DNU | V3p3 | V3p3 | | VSS | VSS | 9 |
| | | RZQ_2 | V3p3 | V3p3 | | VSS | VSS | 10 |
| DNU | DNU | RB | VSS | VSS | | V1p8 | V1p8 | 11 |
| | | DNU | F4_WP | F4_CE2 | | V1p8 | V1p8 | 12 |
| DNU | DNU | F4_Vref | VSS | F4_CE3 | | | | 13 |
| | | VSS | F4_CE0 | VSS | F4_RE_P | VSS | F4_DQS_N | 14 |
| DNU | DNU | VSS | F4_CE1 | VSS | F4_RE_N | VSS | F4_DQS_P | 15 |
| | | VCCF | | VCCF | | DNU | | 16 |
| DNU | DNU | DNU | | VCCF | | SMBus_CLK | | 17 |
| DNU | DNU | DNU | | ALERT_N | | SMBus_DATA | | 18 |

FIG. 4A

Table 400b

| R | P | N | M | L | K | J | |
|---|---|---|---|---|---|---|---|
| VSS |  | VSS |  | VSS |  | VSS | 1 |
| VSS |  | VSS |  | VSS |  | VSS | 2 |
| VSS |  | VSS |  | VSS |  | VSS | 3 |
| VSS | PERp2 | VSS | PETp1 | VSS | PERp1 | VSS | 4 |
| VSS | PERn2 | VSS | PETn1 | VSS | PERn1 | VSS | 5 |
|  |  |  |  |  |  |  | 6 |
| V1p8 | VSS | RFU | RFU | RFU | VSS | V1p2 | 7 |
| V1p8 | VSS | RFU | RFU | RFU | VSS | V1p2 | 8 |
| VSS | VSS | RFU | VSS | RFU | VSS | VSS | 9 |
| VSS | VSS | RFU | VSS | RFU | VSS | VSS | 10 |
| V1p8 | VSS | RFU | RFU | RFU | VSS | V1p2 | 11 |
| V1p8 | VSS | RFU | RFU | RFU | VSS | V1p2 | 12 |
|  |  |  |  |  |  |  | 13 |
| VSS | F4_D0 | VSS | F4_D2 | VSS | F4_D3 | VSS | 14 |
| VSS | F4_D1 | VSS | F4_WE | VSS | F4_D4 | VSS | 15 |
| DNU |  | DNU |  | DNU |  | VCCF | 16 |
| JTAG_TDI |  | JTAG_TCK |  | DNU |  | VCCF | 17 |
| JTAG_TDO |  | JTAG_TMS |  | JTAG_TRST_N |  | VCCF | 18 |

FIG. 4B

Table 400c

| H | G | F | E | D | C | B | A | |
|---|---|---|---|---|---|---|---|---|
| | VSS | | VSS | | VSS | DNU | DNU | 1 |
| | VSS | | VSS | | VSS | DNU | DNU | 2 |
| | VSS | | VSS | | VSS | | | 3 |
| SAT-B/PETp0 | VSS | SAT-B/PERp0 | VSS | REFCLKp | VSS | DNU | DNU | 4 |
| SAT-B/PETn0 | VSS | SAT-B/PERn0 | VSS | REFCLKn | VSS | | | 5 |
| | | VSS | VSS | VSS | DNU | CAL-P | DNU | 6 |
| V1p2 | V1p2 | | VSS | PERST# | XTAL-OUT | | | 7 |
| V1p2 | V1p2 | | PCIe-DEVSLP | CLKREQ# | XTAL-IN | DNU | DNU | 8 |
| VSS | VSS | | V3p3 | V3p3 | DNU | | | 9 |
| VSS | VSS | | V3p3 | V3p3 | RZQ_1 | | | 10 |
| V1p2 | V1p2 | | VSS | VSS | DNU | DNU | DNU | 11 |
| V1p2 | V1p2 | | PERWAKE# | DNU | DNU | | | 12 |
| | | | DIAG0 | DIAG1 | RFU | DNU | DNU | 13 |
| F4_D5 | VSS | PEDET* | VSS | SUSCLK | F4_D7 | | | 14 |
| F4_ALE | VSS | F4_CLE | VSS | F4_D6 | VSS | DNU | DNU | 15 |
| | VCCQF | | VCCQF | | DNU | | | 16 |
| | VCCQF | | VCCQF | | DNU | DNU | DNU | 17 |
| | VCCQF | | VCCQF | | DNU | DNU | DNU | 18 |

SYSTEM-IN-PACKAGE LOGIC AND METHOD TO CONTROL AN EXTERNAL PACKAGED MEMORY DEVICE

BACKGROUND

1. Technical Field

Embodiments described herein relate generally to microelectronic devices and packages, and more particularly, but not exclusively, relate to operation of a solid state drive with a system-in-package.

2. Background Art

Multi-chip assemblies can provide greater integration and enhanced function in a single package. Integration of IC devices fabricated by different process flows into a single package is possible, and can pave the way for system-in-package (SIP) solutions. In addition to the aforementioned benefits, these SIP or multi-chip packages may exhibit reduced form factors, perhaps including both a smaller overall height as well as a smaller footprint—e.g., the surface area occupied by the package on a next-level component, such as a circuit board—as compared to a similar system having multiple, separate components mounted on a circuit board or other substrate.

BRIEF DESCRIPTION OF THE DRAWINGS

The various embodiments of the present invention are illustrated by way of example, and not by way of limitation, in the figures of the accompanying drawings and in which.

DETAILED DESCRIPTION

While the present disclosure is described herein with reference to illustrative embodiments for particular applications, it should be understood that such embodiments are exemplary only and that the invention as defined by the appended claims is not limited thereto. Indeed for the sake of illustration the technologies described herein may be discussed in the context of one or more use models in which a system-in-package (SIP) of a mobile device is coupled to control another packaged device including non-volatile memory (NVM)—e.g., the packaged device to operate as a solid state drive (SSD). Such discussions are exemplary only, and it should be understood that all or a portion of the technologies described herein may be used in other contexts. Indeed the technologies described herein may be used with any suitable SIP and a packaged memory coupled thereto.

Those skilled in the relevant art(s) with access to the teachings provided herein will recognize additional modifications, applications, and embodiments within the scope of this disclosure, and additional fields in which embodiments of the present disclosure would be of utility.

The technologies described herein may be implemented in one or more electronic devices. Non-limiting examples of electronic devices that may utilize the technologies described herein include any kind of mobile device and/or stationary device, such as cameras, cell phones, computer terminals, desktop computers, electronic readers, facsimile machines, kiosks, netbook computers, notebook computers, internet devices, payment terminals, personal digital assistants, media players and/or recorders, servers (e.g., blade server, rack mount server, combinations thereof, etc.), set-top boxes, smart phones, tablet personal computers, ultra-mobile personal computers, wired telephones, combinations thereof, and the like. Such devices may be portable or stationary. In some embodiments the technologies described herein may be employed in a desktop computer, laptop computer, smart phone, tablet computer, netbook computer, notebook computer, personal digital assistant, server, combinations thereof, and the like. More generally, the technologies described herein may be employed in any electronic device to which multiple port controllers are configured to access the same physical layer circuitry.

Certain embodiments variously provide techniques and/or mechanisms for expanding storage that is to operate under the control of a system in package (SIP). SIPs are conventionally seen, at least in terms of the memory sub-system, as being systems that are each complete unto themselves. For example, the amount of memory to be controlled by a SIP is traditionally considered to be limited by the dimensions of the SIP's package. The prospect of implementing a SIP that controls more memory has been viewed as a problem of designing a larger SIP package to include such additional memory and/or developing higher-density memory to include in the SIP package. By contrast, certain embodiments are based on a realization that, although a SIP can only have so much memory embedded within the SIP package itself, a SIP may be developed that includes a memory controller capable of supporting more memory, where additional interface hardware is included in the SIP to support coupling of the SIP to an external packaged SSD or other such memory device.

Figure 1:
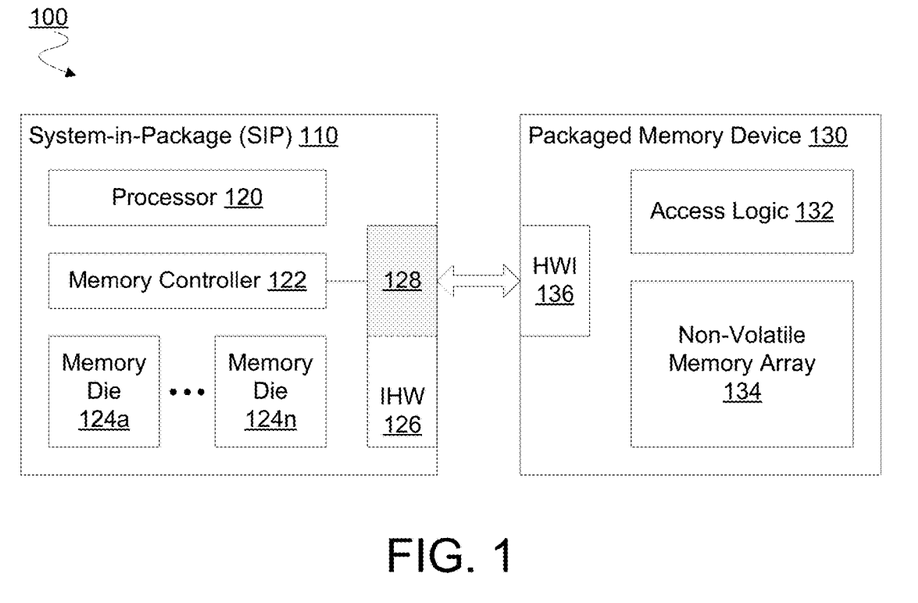
FIG. 1 is a high-level functional block diagram illustrating elements of a system to provide access to a packaged solid state drive device according to an embodiment.

FIG. 1 illustrates elements of a platform 100 to provide access to a packaged memory device (also referred to herein as a "memory package") according to an embodiment. Platform 100 may comprise, for example, a hardware platform of a desktop computer, laptop computer, handheld device (e.g., smart phone, tablet, etc.) or any of a variety of other computing-capable devices.

In an embodiment, platform 100 includes a system-in-package (SIP) 110 coupled to a packaged memory device 130. SIP 110 and packaged memory device 130 may be distinct packaged devices that are coupled to one another directly or indirectly—e.g., where the packaged devices are arranged in a stacked package-on-package configuration or, alternatively, are coupled to one another via a substrate (not shown) such as a printed circuit board. For example, SIP 110 may include interface hardware IHW 126 including conductive contacts—e.g., pads, pins, balls and/or the like—that are to variously exchange signals between SIP 110 and external hardware (not shown) that is included in or to couple to platform 100. At least some portion of IHW 126 may include contacts 128 to couple SIP 110 to respective contacts of a hardware interface HWI 136 of packaged memory device 130.

SIP 110 may include logic—e.g., including hardware, firmware and/or software—to serve as a host that controls a solid state drive of packaged memory device 130. For example, such a solid state drive may include non-volatile memory array 134—e.g., including NAND-based storage media—and access logic 132 to provide host logic of SIP 110 with access to non-volatile memory array 134. Examples of additional or alternative storage media of non-volatile memory array 134 include, but are not limited to, phase change memory, flash memory, ferroelectric random-access memory (FeRAM), nanowire-based non-volatile memory, memory that incorporates memristor technology, three dimensional (3D) cross point memory such as phase change memory (PCM), spin-transfer torque memory (STT-RAM), magnetoresistive random access memory (MRAM) and/or the like. Access logic 132 may include circuitry and/or other logic—e.g., including firmware, address translation circuitry, command parsing logic, address decode logic, I/O control logic and/or the like—to process input/output (IO) requests that packaged memory device 130 receives from SIP 110. SIP 110 may comprise a processor 120 and a memory controller 122, where execution of one or more processes with processor 120 results in memory controller 122 performing I/O operations to read data from, and/or write data to, memory of SIP (as represented by the illustrative one or more memory die 124a, . . . , 124n). Alternatively or in addition, operation of processor 120 may result in memory controller 122 performing I/O operations to read data from, and/or write data to, non-volatile memory array 134. By way of example and not limitation, access to non-volatile memory array 134 by memory controller 122 may include contacts 128 and HWI 136 exchanging some or all of a reference voltage, core supply voltage, I/O supply voltage, one or more data signals and any of a variety of control signals including, but not limited to, write protect, ready/busy, chip enable, read enable, data strobe, address latch enable, command latch enable. The particular function of such voltages and signals may be adapted from conventional SSD control techniques, which are not detailed herein and are not limiting on some embodiments.

Figure 2:
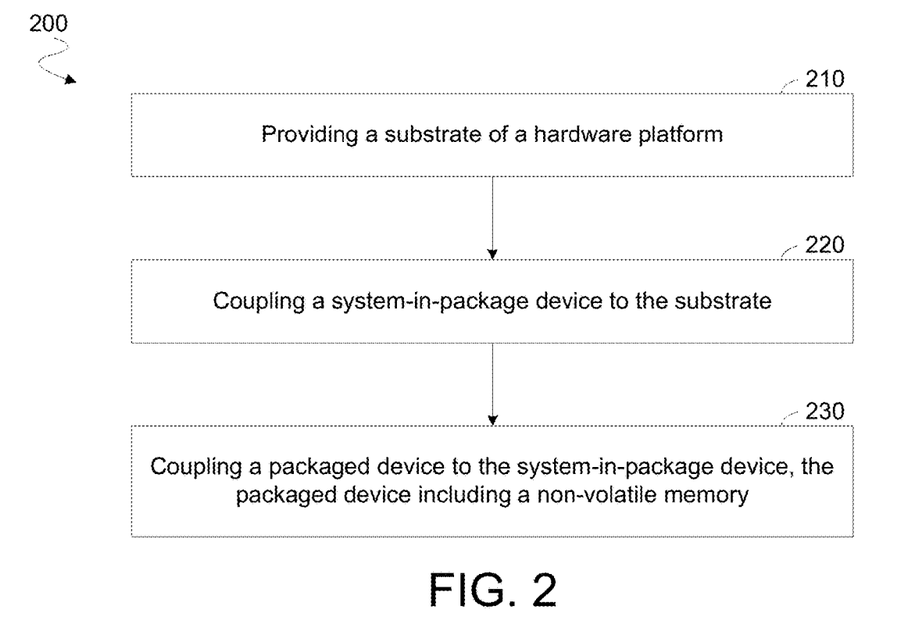
FIG. 2 is a flow diagram illustrating elements of a method of fabricating a hardware platform including a system-in package and a packaged solid state drive device according to an embodiment.

FIG. 2 illustrates elements of a method 200 for enabling operation of an external packaged memory by a SIP device, according to an embodiment. Method 200 may assemble some or all of a system having features such as those of platform 100, for example.

Method 200 may comprise, at 210, providing a substrate of a hardware platform—e.g., where the substrate includes a printed circuit board, a flexible printed circuit substrate and/or the like. The substrate may include conductive structures (e.g., including interface contacts and signal lines) to accommodate coupling to, and operation of, a SIP and another packaged device—e.g., where the SIP and the packaged device are arranged in a stacked, package-on-package configuration or in a coplanar configuration. In an embodiment, method 200 further includes, at 220, coupling a SIP device to the substrate. The SIP device may include processor logic (e.g., including a general purpose processor and/or an application specific processor) and a memory controller to provide the processor logic with access to local memory of the SIP. For example, the SIP may further comprise one or more memory dies each controlled by the memory controller. The local memory may include a solid state drive of the SIP.

Method 200 may further comprise, at 230, coupling to the SIP device a packaged device that includes a non-volatile memory—e.g., the packaged device to operate as a solid state drive controlled by the SIP device. The coupling at 230 may include coupling the memory controller of the SIP to provide the processor logic of the SIP with access to the solid state drive of the packaged device. An exterior of the package material of the SIP may have interface hardware disposed therein or thereon. The interface hardware may include a first plurality of contacts each to couple to the packaged device, as well as a second plurality of contacts that, for example, may couple the SIP to hardware other than the packaged device. The first plurality of contacts and the second plurality of contacts may have, respectively, a first arrangement and a second arrangement. The first plurality of contacts may be distributed among the second plurality of contacts, for example. In an embodiment, an interface standard—e.g., a Peripheral Component Interconnect Express (PCIe) standard such as that of the PCIe specification, revision 3.0 released November 2010 by the PCI Special Interest Group (PCI-SIG), a M.2 specification that is under consideration by the PCI Special Interest Group, or the like—may describe an arrangement of interface contacts, wherein, of the first arrangement and the second arrangement, only the second arrangement conforms to the arrangement of interface contacts. For example, the first arrangement may correspond to an arrangement of elements that the interface standard describes as reserved (e.g., for future use). The first contacts may provide to the packaged device a supply voltage, clock signal, command/control information, address information, data and/or any of various other voltages or signals to access the solid state drive on behalf of a host process of the SIP.

Figure 3A:
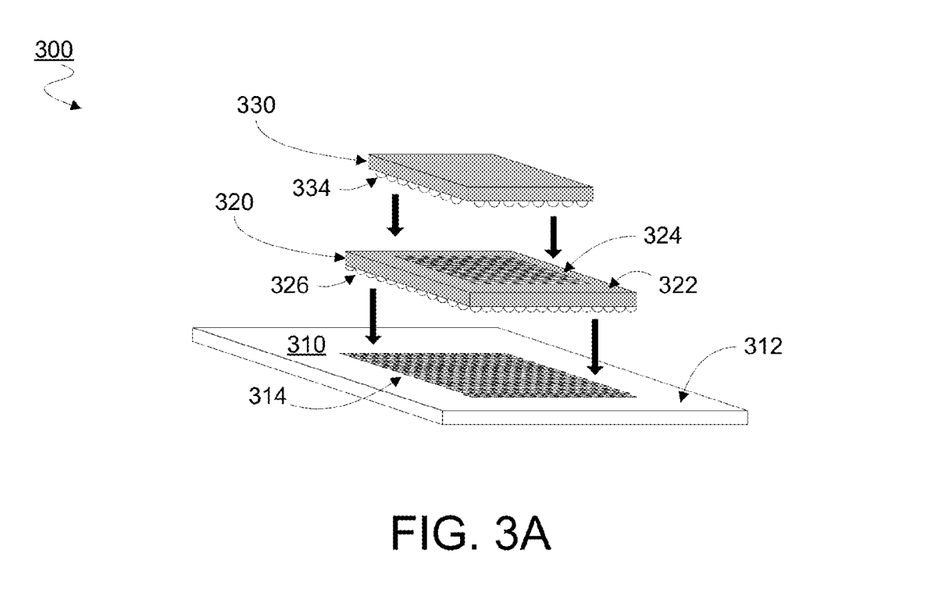
FIGS. 3A and 3B are perspective views each illustrating respective features of assembly processing according to a corresponding embodiment.
Figure 3B:
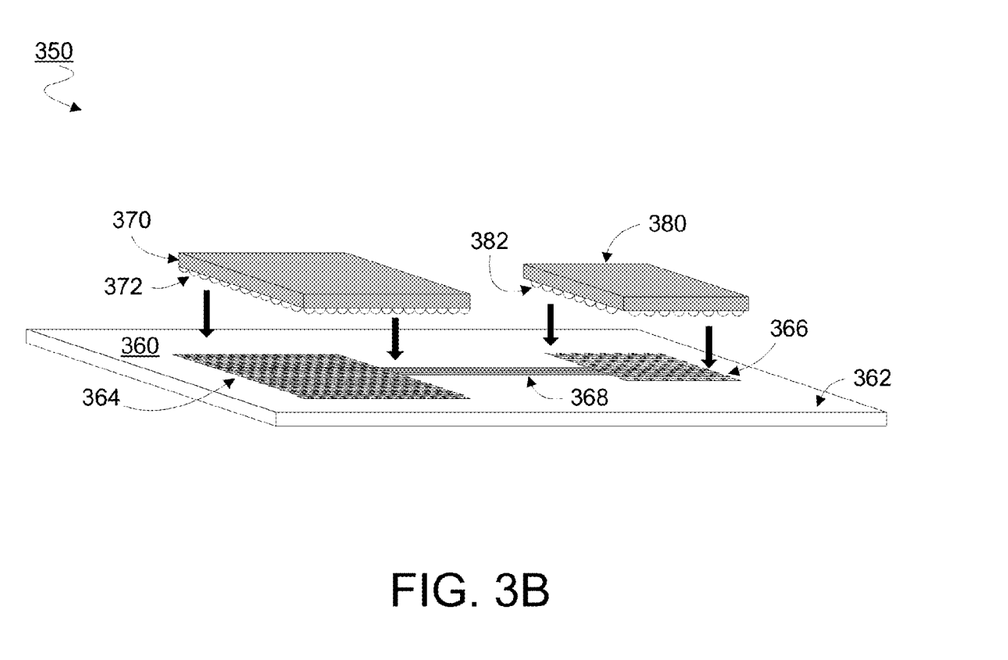

FIGS. 3A, 3B show exploded perspective views of respective assemblies 300, 350 each to provide access to a packaged memory according to a corresponding embodiment. Assembly 300 may include a substrate 310 such as a printed circuit board, where interface hardware 314 is formed in or on one side 312 of substrate 310. Interface hardware 314 may include conductive contacts to accommodate coupling of substrate 310 to a stacked configuration including, for example, a first package 320 and a second package 330.

In the illustrative embodiment shown, first interface hardware 326 (e.g., including a ball grid array) of first package 320 couples directly to interface hardware 314. Alternatively or in addition, second interface hardware 324 disposed in or on a side 322 of first package 320 may directly couple to hardware interface 334 (e.g., including a ball grid array) of second package 330. Side 322 may be obverse to the side of first package 330 that has interface hardware 326 formed therein or thereon.

First package 320 may provide functionality of a system-in-package—e.g., where first package 320 includes processor logic, local memory and a memory controller to process requests from the processor logic for access to the local memory. First package 320 may include some or all of the features of SIP 110, for example. Through mold via (TMV) structures of first package 320 may provide for coupling SIP circuitry to second interface hardware 324—e.g., to aid communication between first package 320 and second package 330. Due in part to such TMV structures and the coupling of first package 320 and second package 330 to one another, the memory controller of first package 320 may be configured to control, and provide access to, a non-volatile memory of second package 330—e.g., where non-volatile media of second package 330 is to function as part of a SSD.

As a result, the SIP of first package 110 may be able to avail of and control additional SSD resources that are external to first package 110. Second package 330 may include some or all features of packaged memory device 130, in one embodiment.

In the alternative embodiment of assembly 350, first interface hardware 364 and second interface hardware 366 are variously formed in or on a side 362 of a substrate 360 (e.g., a printed circuit board). First interface hardware 364 and second interface hardware 366 may be coupled to one another by signal lines 368 printed in or on substrate 360. In the illustrative embodiment shown, interface hardware 372 (e.g., including a ball grid array) of first package 370 couples directly to interface hardware 364. Alternatively or in addition, interface hardware 382 (e.g., including a ball grid array) of second package 380 may directly couple to interface hardware 366. Accordingly, first package 370 and second package 380 may be arranged in a coplanar configuration on side 362—e.g., where signal lines 368 variously enable some or all of voltages, clock signals, control signals, data, address information and/or the like to be exchanged between first package 370 and second package 380. First package 370 and second package 380 may provide, respectively, SIP functionality of first package 320 and non-volatile memory functionality of second package 330, for example.

In one embodiment, interface hardware 372 includes a first plurality of contacts having a first arrangement to couple to respective contacts of interface hardware 364 that, in turn, are variously coupled (e.g., directly coupled) to signal lines 368. Interface hardware 372 may further comprise a second plurality of contacts having a second arrangement to variously couple to respective contacts of interface hardware 364 other than any contact that is coupled to one of signal lines 368. For example, the second plurality of contacts may be for the first package 370 to communicate with some other hardware (not shown)—i.e., other than second package 380—that is included in or to couple to assembly 350. The second arrangement of the second plurality of contacts may conform to an arrangement described in an interface standard—e.g., a PCIe standard. The interface standard may describe an arrangement of interface contacts to which, of the first arrangement and the second arrangement, only the second arrangement conforms. For example, the first arrangement may correspond to an arrangement of elements that the interface standard describes only as being reserved.

Figure 4A:
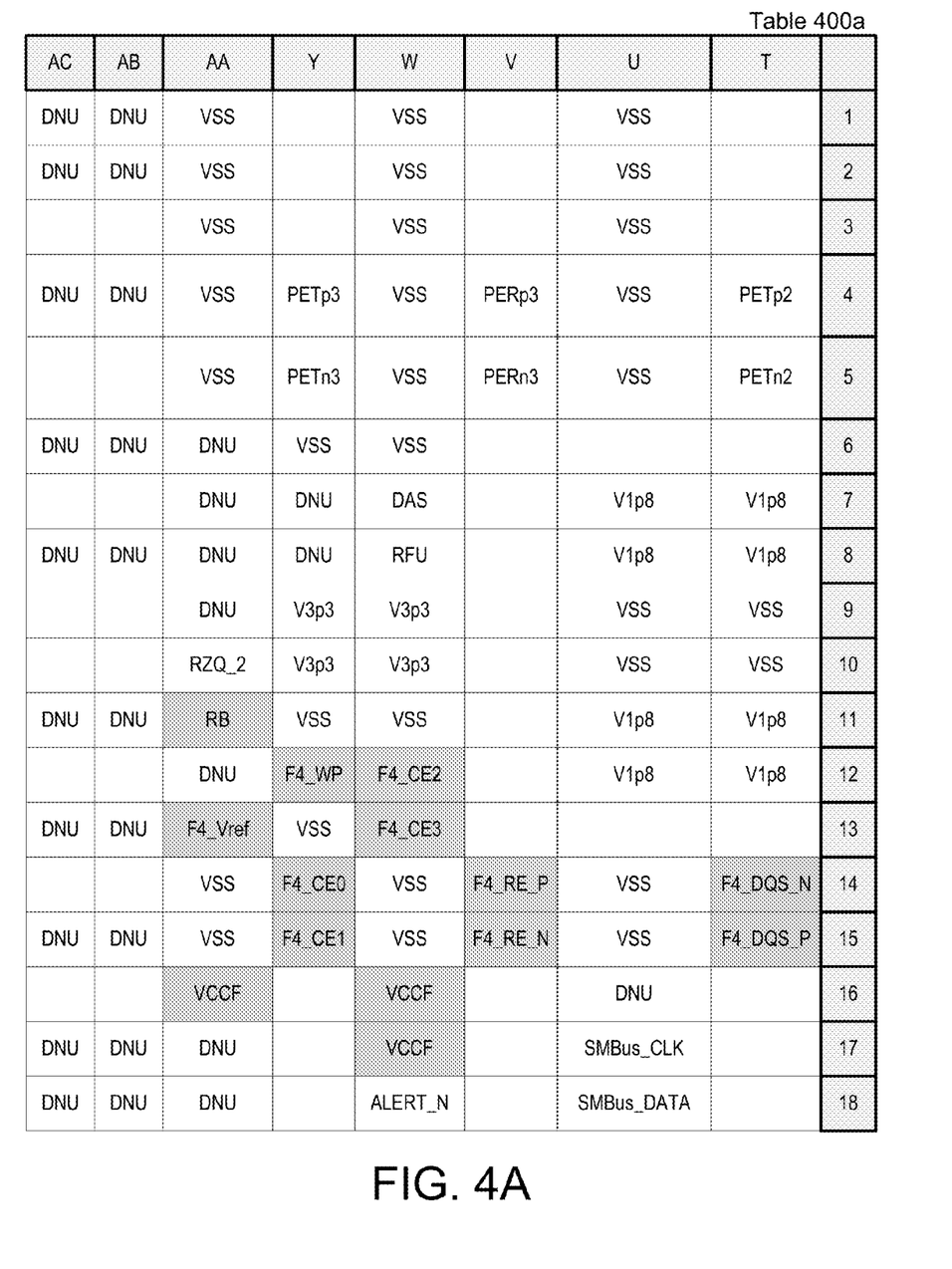
FIGS. 4A, 4B and 4C are tables illustrating a pinout of a system-in-package according to an embodiment.
Figure 4B:
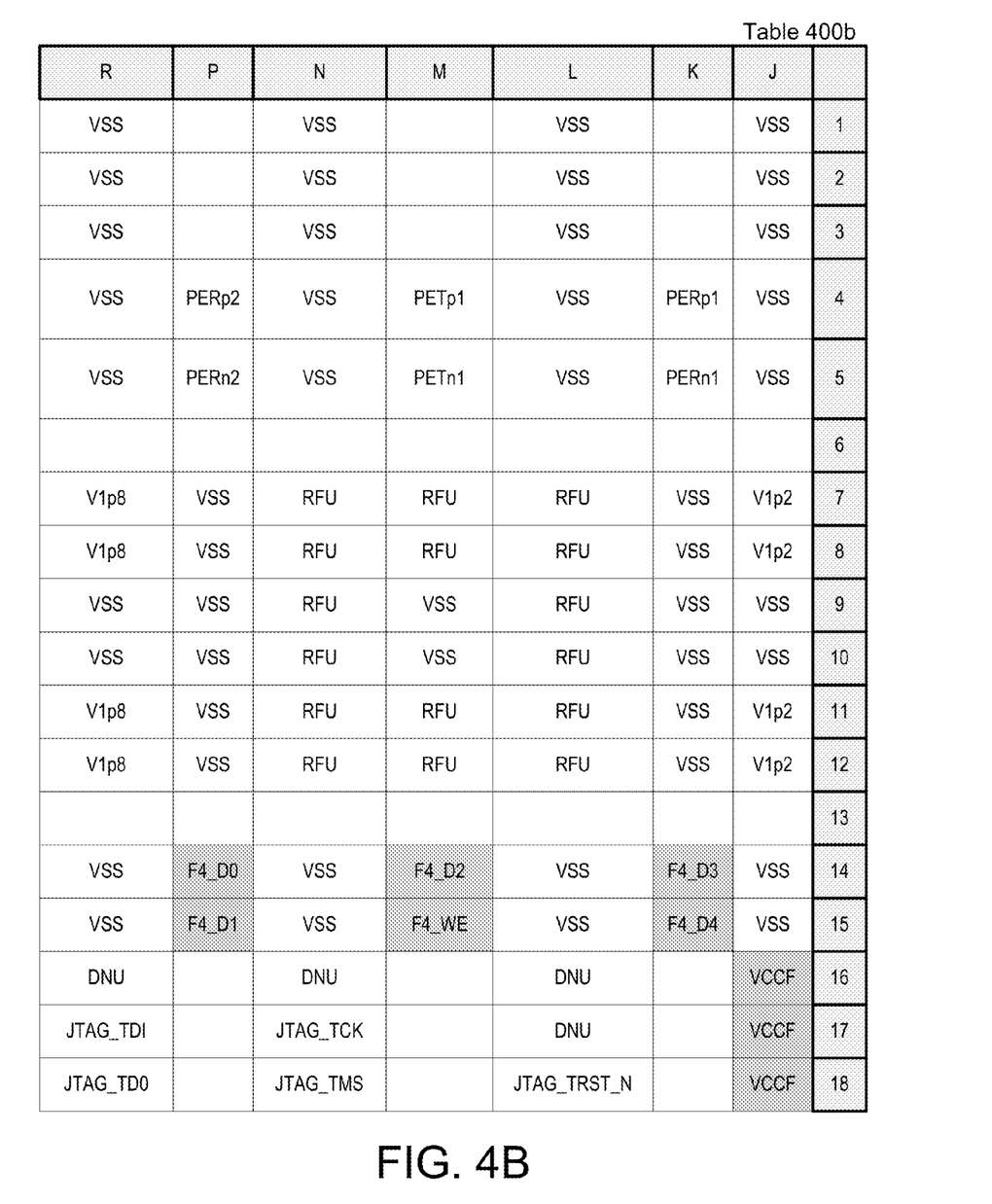
Figure 4C:
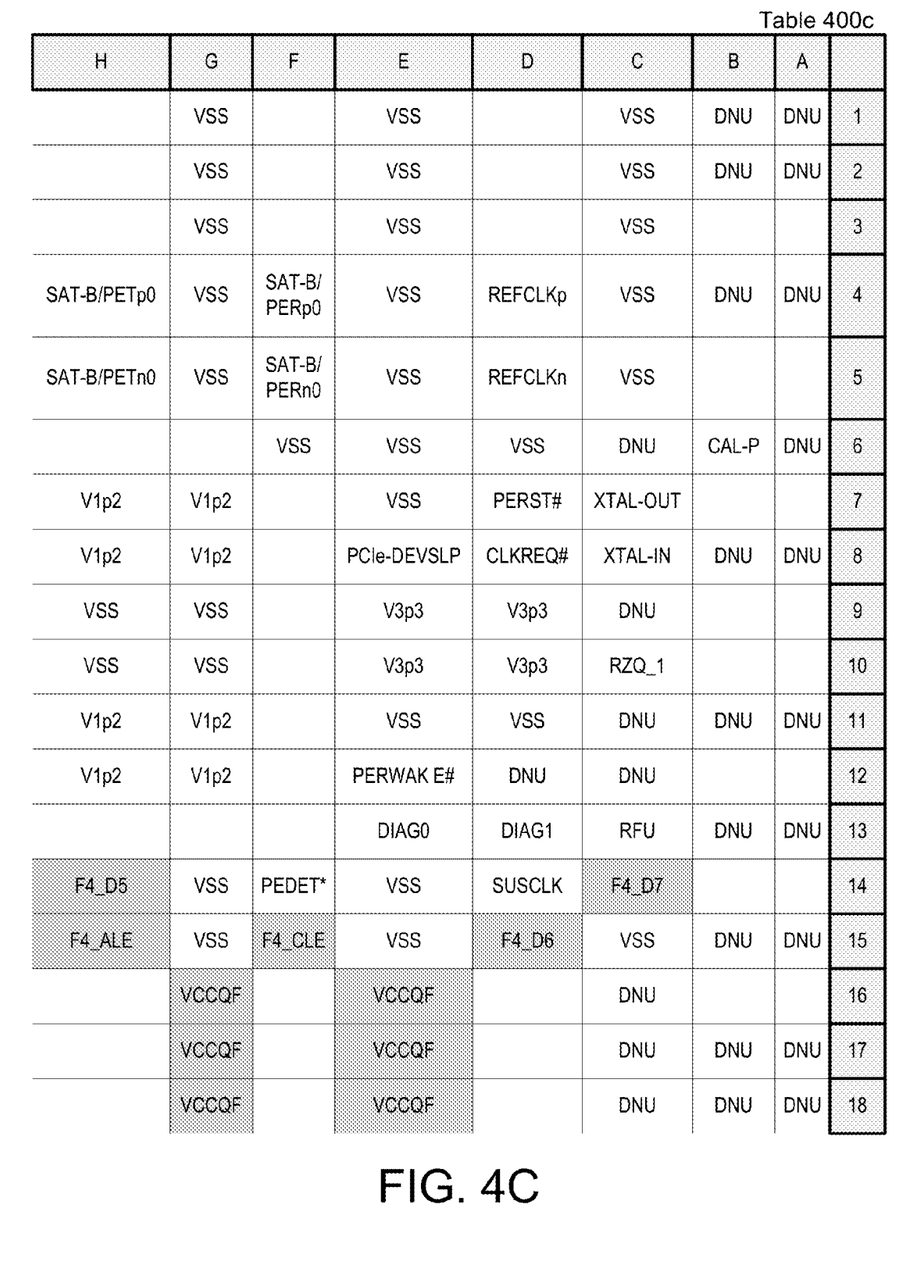

FIGS. 4A-4C show respective tables 400a, 400b, 400c listing, for a SIP device according to an embodiment, an arrangement of a hardware interface including contacts to couple the SIP device to a memory package. Tables 400a, 400b, 400c variously list, for rows 1 through 18 of the hardware interface, respective contacts to be included in the rows along twenty-three (23) columns from a column A to a column AC. Accordingly, tables 400a, 400b, 400c may alternatively be concatenated row-wise into a single table describing the arrangement of such a hardware interface.

The arrangement of interface hardware shown in tables 400a, 400b, 400c may be that of IHW 126 or interface hardware 372, for example. In the illustrative embodiment represented in tables 400a, 400b, 400c, a hardware interface of a SIP includes a first plurality of contacts (shaded) that are to couple, directly or indirectly, to a memory package, and a second plurality of contacts (unshaded) that may not necessarily couple to that memory package. Table 1 below includes descriptions of the second plurality of contacts.

TABLE 1

SIP Interface Contacts

| Label | Description |
| --- | --- |
| ALERT_N | Alert notification to master |
| CAL-P | PHY calibration resistor |
| CLKREQ# | Clock request signal |
| DAS | Device Activity Signal |
| DIAG0 | Diagnostic test mode contact |
| DIAG1 | Diagnostic test mode contact |
| DNU | Do not use |
| JTAG_TCK | JTAG test clock signal (refer to IEEE 1149.1) |
| JTAG_TDI | JTAG test data in (refer to IEEE 1149.1) |
| JTAG_TDO | JTAG test data out (refer to IEEE 1149.1) |
| JTAG_TMS | JTAG test mode select (refer to IEEE 1149.1) |
| JTAG_TRST_N | JTAG test reset (refer to IEEE 1149.1) |
| PCIe-DEVSLP | Device sleep signal |
| PEDET* | Host interface indication |
| PERnx | PCIe receive signal (for differential signal pair) |
| PERpx | PCIe receive signal (for differential signal pair) |
| PERST# | Functional reset signal (see PCIe Mini CEM specification) |
| PERWAK.E# | PCIe PME wake signal |
| PETnx | PCIe transmit signal (for differential signal pair) |
| PETpx | PCIe transmit signal (for differential signal pair) |
| REFCLKn | Reference clock signal (for differential signal pair) |
| REFCLKp | Reference clock signal (for differential signal pair) |
| RFU | Reserved for future use |
| RZQ_1 | Calibration resistor signal |
| RZQ_2 | Calibration resistor signal |
| SAT-B/PERn0 | Refer to Serial ATA specifications |
| SAT-B/PERp0 | Refer to Serial ATA specifications |
| SAT-B/PETn0 | Refer to Serial ATA specifications |
| SAT-B/PETp0 | Refer to Serial ATA specifications |
| SMBus_CLK | SMBus Clock |
| SMBus_DATA | SMBus Data |
| SUSCLK | Supply clock signal |
| V1p2 | Input voltage 1.2 V |
| V1p8 | Input voltage 1.8 V |
| V3p3 | Input voltage 3.3 V |
| VSS | Supply voltage |
| XTAL-IN | Crystal input |
| XTAL-OUT | Crystal output |

The arrangement of the second plurality of contacts may be compatible with an interface standard such as that of a proposed M.2 specification that is under consideration by the PCI Special Interest Group. Table 2 below includes a description of the first plurality of contacts variously shown in tables 400a, 400b, 400c.

TABLE 2

SIP Interface Contacts to couple to external NVM package

| Label | Description |
| --- | --- |
| F4_ALE | NVM package - address latch enable |
| F4_CEx | NVM package - chip enable (chip x) |
| F4_CLE | NVM package - command latch enable |
| F4_Dx | NVM package - data I/O (data line x) |
| F4_DQS_N | NVM package - data strobe (for differential signal pair) |
| F4_DQS_P | NVM package - data strobe (for differential signal pair) |
| F4_RE_N | NVM package - read enable (for differential signal pair) |
| F4_RE_P | NVM package - read enable (for differential signal pair) |
| F4_Vref | NVM package - reference voltage |
| F4_WE | NVM package - write enable |
| F4_WP | NVM package - write protect |
| RB | NVM package - ready/busy |
| VCCF | NVM package - core power supply |
| VCCQF | NVM package - I/O power supply |

The arrangement of the first plurality of contacts, as shown in tables 400a, 400b, 400c, is not set forth in the proposed M.2 standard mentioned above. However, the arrangement of the first plurality of contacts avails of corresponding arrangement of contacts that, according to the proposed M.2 standard, are described only as reserved for future use. Tables 400a, 400b, 400c thus illustrate one example of an embodiment wherein interface hardware of a SIP includes first contacts that conform to an interface standard, where the interface hardware further comprises second contacts (e.g., interleaved with or otherwise distributed among the first contacts) to couple the SIP to a packaged NVM device.

Figure 5:
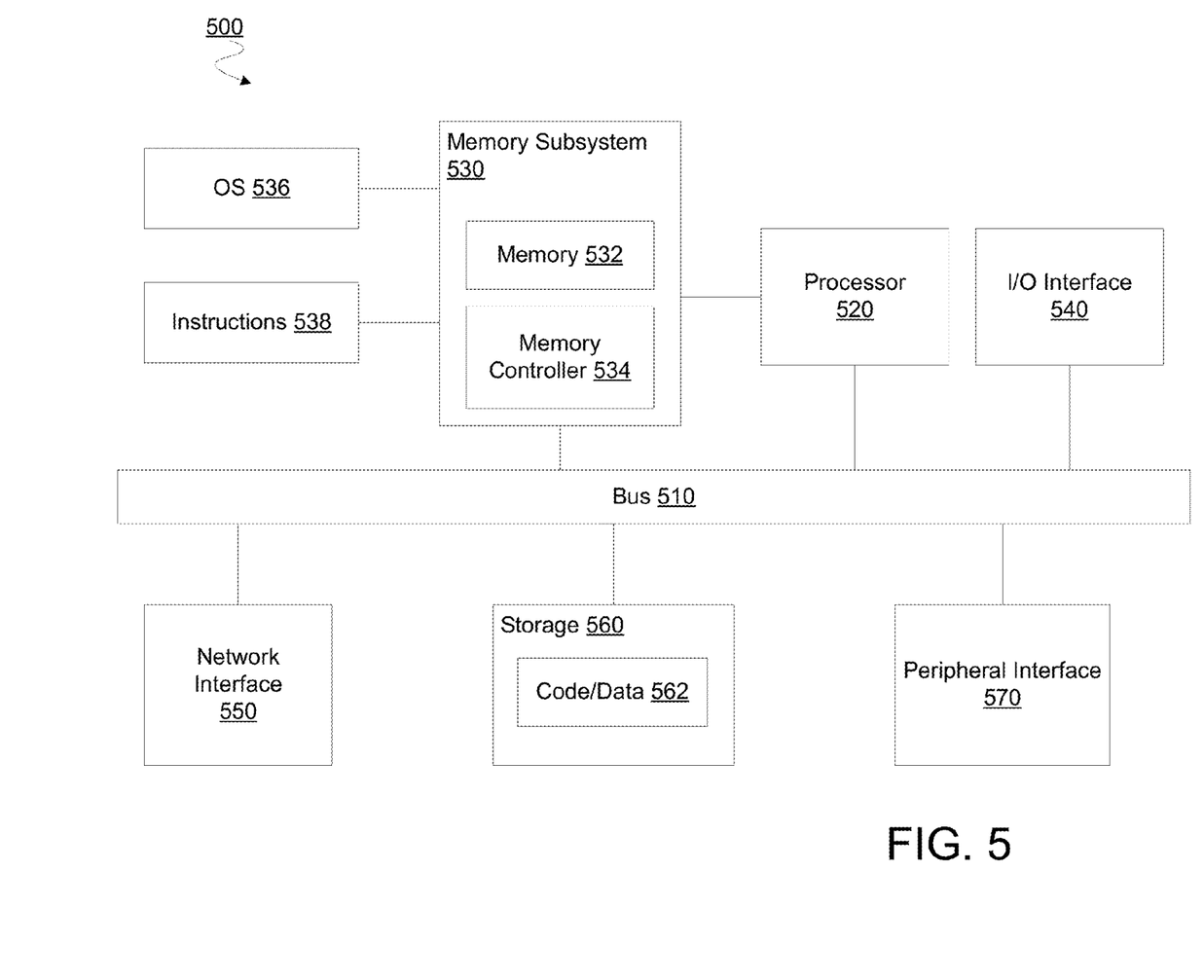
FIG. 5 is a high-level functional block diagram illustrating elements of a computer system to access a packaged solid state drive device according to an embodiment.

FIG. 5 is a block diagram of an embodiment of a computing system in which operation of a solid state drive may be implemented. System 500 represents a computing device in accordance with any embodiment described herein, and may be a laptop computer, a desktop computer, a server, a gaming or entertainment control system, a scanner, copier, printer, or other electronic device. System 500 may include processor 520, which provides processing, operation management, and execution of instructions for system 500. Processor 520 may include any type of microprocessor, central processing unit (CPU), processing core, or other processing hardware to provide processing for system 500. Processor 520 controls the overall operation of system 500, and may be or include, one or more programmable general-purpose or special-purpose microprocessors, digital signal processors (DSPs), programmable controllers, application specific integrated circuits (ASICs), programmable logic devices (PLDs), or the like, or a combination of such devices.

Memory subsystem 530 represents the main memory of system 500, and provides temporary storage for code to be executed by processor 520, or data values to be used in executing a routine. Memory subsystem 530 may include one or more memory devices such as read-only memory (ROM), flash memory, one or more varieties of random access memory (RAM), or other memory devices, or a combination of such devices. Memory subsystem 530 stores and hosts, among other things, operating system (OS) 536 to provide a software platform for execution of instructions in system 500. Additionally, other instructions 538 are stored and executed from memory subsystem 530 to provide the logic and the processing of system 500. OS 536 and instructions 538 are executed by processor 520.

Memory subsystem 530 may include memory device 532 where it stores data, instructions, programs, or other items. In one embodiment, memory subsystem includes memory controller 534 which includes mechanisms for providing access to memory device 532. In one embodiment, memory controller 534 provides commands to memory device 532. The commands may be for memory device 532 to access data—e.g., on behalf of processor 520.

Processor 520 and memory subsystem 530 are coupled to bus/bus system 510. Bus 510 is an abstraction that represents any one or more separate physical buses, communication lines/interfaces, and/or point-to-point connections, connected by appropriate bridges, adapters, and/or controllers. Therefore, bus 510 may include, for example, one or more of a system bus, a Peripheral Component Interconnect (PCI) bus, a HyperTransport or industry standard architecture (ISA) bus, a small computer system interface (SCSI) bus, a universal serial bus (USB), or an Institute of Electrical and Electronics Engineers (IEEE) standard 1394 bus (commonly referred to as "Firewire"). The buses of bus 510 may also correspond to interfaces in network interface 550.

System 500 may also include one or more input/output (I/O) interface(s) 540, network interface 550, one or more internal mass storage device(s) 560, and peripheral interface 570 coupled to bus 510. I/O interface 540 may include one or more interface components through which a user interacts with system 500 (e.g., video, audio, and/or alphanumeric interfacing). Network interface 550 provides system 500 the ability to communicate with remote devices (e.g., servers, other computing devices) over one or more networks. Network interface 550 may include an Ethernet adapter, wireless interconnection components, USB (universal serial bus), or other wired or wireless standards-based or proprietary interfaces.

Storage 560 may be or include any conventional medium for storing large amounts of data in a nonvolatile manner, such as one or more magnetic, solid state, or optical based disks, or a combination. Storage 560 holds code or instructions and data 562 in a persistent state (i.e., the value is retained despite interruption of power to system 500). Storage 560 may be generically considered to be a "memory," although memory 530 is the executing or operating memory to provide instructions to processor 520. Whereas storage 560 is nonvolatile, memory 530 may include volatile memory (i.e., the value or state of the data is indeterminate if power is interrupted to system 500).

Peripheral interface 570 may include any hardware interface not specifically mentioned above. Peripherals refer generally to devices that connect dependently to system 500. A dependent connection is one where system 500 provides the software and/or hardware platform on which operation executes, and with which a user interacts. In an embodiment, system 500 includes a SIP and a packaged device coupled to the SIP, where the packaged device includes a solid state drive to be controlled by a memory controller of the SIP. For example, the SIP may include at least memory sub-system 530 and processor 520. The other packaged device may include at least part of storage 560 coupled for accessibility by processor 520 via memory controller 534.

Figure 6:
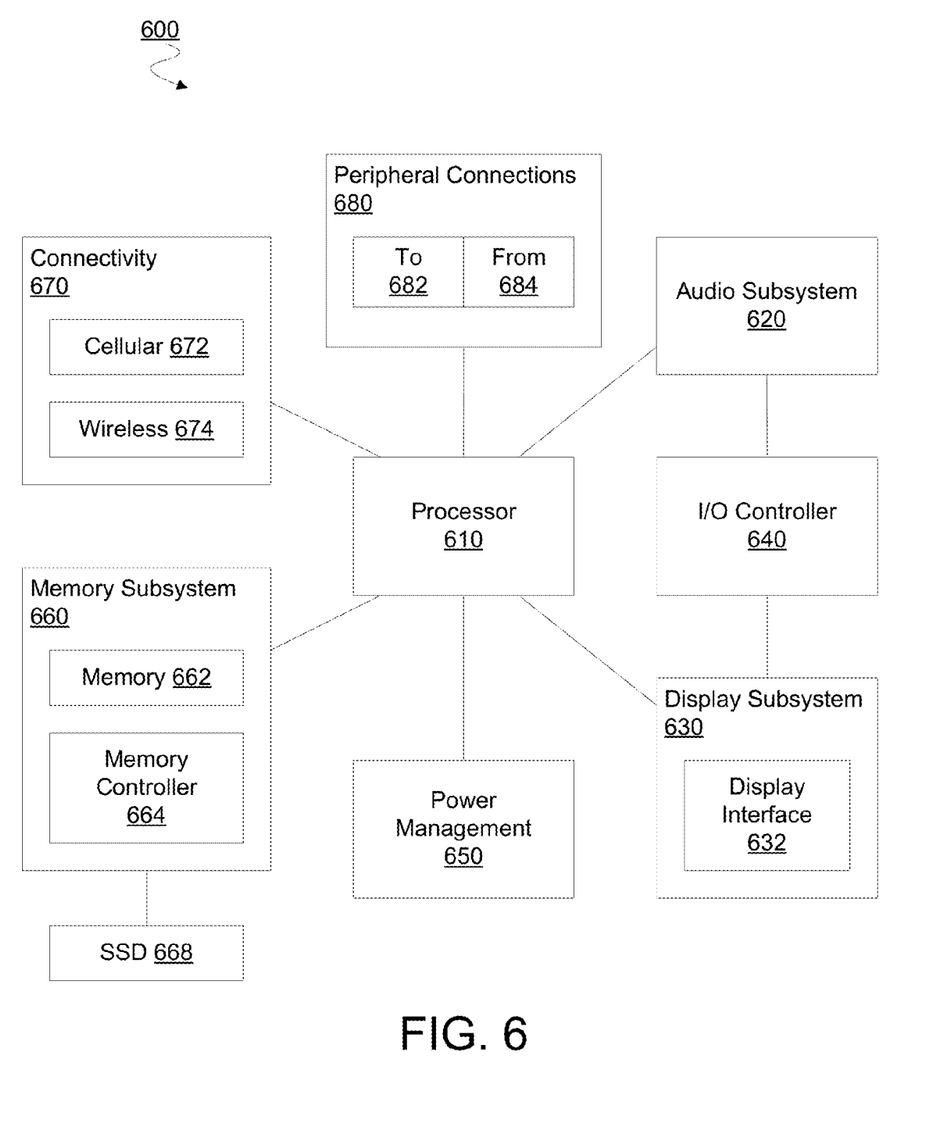
FIG. 6 is a high-level functional block diagram illustrating elements of a mobile device to access a packaged solid state drive device according to an embodiment.

FIG. 6 is a block diagram of an embodiment of a mobile device in which operation of a solid state drive may be implemented. Device 600 represents a mobile computing device, such as a computing tablet, a mobile phone or smartphone, a wireless-enabled e-reader, or other mobile device. It will be understood that certain of the components are shown generally, and not all components of such a device are shown in device 600.

Device 600 may include processor 610, which performs the primary processing operations of device 600. Processor 610 may include one or more physical devices, such as microprocessors, application processors, microcontrollers, programmable logic devices, or other processing means. The processing operations performed by processor 610 include the execution of an operating platform or operating system on which applications and/or device functions are executed. The processing operations include operations related to I/O (input/output) with a human user or with other devices, operations related to power management, and/or operations related to connecting device 600 to another device. The processing operations may also include operations related to audio I/O and/or display I/O.

In one embodiment, device 600 includes audio subsystem 620, which represents hardware (e.g., audio hardware and audio circuits) and software (e.g., drivers, codecs) components associated with providing audio functions to the computing device. Audio functions may include speaker and/or headphone output, as well as microphone input. Devices for such functions may be integrated into device 600, or connected to device 600. In one embodiment, a user interacts with device 600 by providing audio commands that are received and processed by processor 610.

Display subsystem 630 represents hardware (e.g., display devices) and software (e.g., drivers) components that provide a visual and/or tactile display for a user to interact with the computing device. Display subsystem 630 may include display interface 632, which may include the particular screen or hardware device used to provide a display to a user. In one embodiment, display interface 632 includes logic separate from processor 610 to perform at least some processing related to the display. In one embodiment, display subsystem 630 includes a touchscreen device that provides both output and input to a user.

I/O controller 640 represents hardware devices and software components related to interaction with a user. I/O controller 640 may operate to manage hardware that is part of audio subsystem 620 and/or display subsystem 630. Additionally, I/O controller 640 illustrates a connection point for additional devices that connect to device 600 through which a user might interact with the system. For example, devices that may be attached to device 600 might include microphone devices, speaker or stereo systems, video systems or other display device, keyboard or keypad devices, or other I/O devices for use with specific applications such as card readers or other devices.

As mentioned above, I/O controller 640 may interact with audio subsystem 620 and/or display subsystem 630. For example, input through a microphone or other audio device may provide input or commands for one or more applications or functions of device 600. Additionally, audio output may be provided instead of or in addition to display output. In another example, if display subsystem includes a touchscreen, the display device also acts as an input device, which may be at least partially managed by I/O controller 640. There may also be additional buttons or switches on device 600 to provide I/O functions managed by I/O controller 640.

In one embodiment, I/O controller 640 manages devices such as accelerometers, cameras, light sensors or other environmental sensors, gyroscopes, global positioning system (GPS), or other hardware that may be included in device 600. The input may be part of direct user interaction, as well as providing environmental input to the system to influence its operations (such as filtering for noise, adjusting displays for brightness detection, applying a flash for a camera, or other features).

In one embodiment, device 600 includes power management 650 that manages battery power usage, charging of the battery, and features related to power saving operation. Memory subsystem 660 may include memory device(s) 662 for storing information in device 600. Memory subsystem 660 may include nonvolatile (state does not change if power to the memory device is interrupted) and/or volatile (state is indeterminate if power to the memory device is interrupted) memory devices. Memory 660 may store application data, user data, music, photos, documents, or other data, as well as system data (whether long-term or temporary) related to the execution of the applications and functions of system 600.

In one embodiment, memory subsystem 660 includes memory controller 664 (which could also be considered part of the control of system 600, and could potentially be considered part of processor 610). Memory controller 664 monitors performance of memory 662. For example, memory controller 664 may issue a command for memory 662 to access data—e.g., on behalf of processor 610. In an embodiment, system 600 includes a SIP and a packaged device coupled to the SIP, where the packaged device includes a solid state drive to be controlled by a memory controller of the SIP. For example, the SIP may include at least memory sub-system 660 and processor 610. The other packaged device may include a solid state drive SSD 668 coupled for accessibility by processor 610 via memory controller 664.

Connectivity 670 may include hardware devices (e.g., wireless and/or wired connectors and communication hardware) and software components (e.g., drivers, protocol stacks) to enable device 600 to communicate with external devices. The device could be separate devices, such as other computing devices, wireless access points or base stations, as well as peripherals such as headsets, printers, or other devices.

Connectivity 670 may include multiple different types of connectivity. To generalize, device 600 is illustrated with cellular connectivity 672 and wireless connectivity 674. Cellular connectivity 672 refers generally to cellular network connectivity provided by wireless carriers, such as provided via GSM (global system for mobile communications) or variations or derivatives, CDMA (code division multiple access) or variations or derivatives, TDM (time division multiplexing) or variations or derivatives, LTE (long term evolution—also referred to as "4G"), or other cellular service standards. Wireless connectivity 674 refers to wireless connectivity that is not cellular, and may include personal area networks (such as Bluetooth), local area networks (such as WiFi), and/or wide area networks (such as WiMax), or other wireless communication. Wireless communication refers to transfer of data through the use of modulated electromagnetic radiation through a non-solid medium. Wired communication occurs through a solid communication medium.

Peripheral connections 680 include hardware interfaces and connectors, as well as software components (e.g., drivers, protocol stacks) to make peripheral connections. It will be understood that device 600 could both be a peripheral device ("to" 682) to other computing devices, as well as have peripheral devices ("from" 684) connected to it. Device 600 commonly has a "docking" connector to connect to other computing devices for purposes such as managing (e.g., downloading and/or uploading, changing, synchronizing) content on device 600. Additionally, a docking connector may allow device 600 to connect to certain peripherals that allow device 600 to control content output, for example, to audiovisual or other systems.

In addition to a proprietary docking connector or other proprietary connection hardware, device 600 may make peripheral connections 680 via common or standards-based connectors. Common types may include a Universal Serial Bus (USB) connector (which may include any of a number of different hardware interfaces), DisplayPort including MiniDisplayPort (MDP), High Definition Multimedia Interface (HDMI), Firewire, or other type.

In one implementation, system-in-package (SIP) device comprises a package material, and circuitry disposed in the package material, the circuitry including a processor, a first memory, and a memory controller including circuitry configured to provide the processor with access to the first memory. The SIP device further comprises interface hardware at an exterior of the package material, the interface hardware to couple the SIP device to a packaged device including a non-volatile memory, wherein, while the SIP device is coupled to the packaged device, the memory controller further to provide the processor with access to the non-volatile memory.

In an embodiment, the interface hardware to provide a supply voltage to the packaged device. In another embodiment, the interface hardware of the SIP device includes a first plurality of contacts having a first arrangement, the first plurality of contacts each to couple to the packaged device, and a second plurality of contacts having a second arrangement, wherein an interface standard describe an arrangement of interface contacts, wherein, of the first arrangement and the second arrangement, only the second arrangement conforms to the arrangement of interface contacts. In another embodiment, the first plurality of contacts are distributed among the second plurality of contacts. In another embodiment, the first arrangement corresponds to an arrangement of elements that the interface standard describes as reserved. In another embodiment, the SIP device is to couple with the packaged device in a package-on-package configuration. In another embodiment, the SIP device and the packaged device are coupled to one another via a substrate.

In another implementation, a method comprises providing a substrate of a hardware platform, coupling a system-in-package (SIP) device to the substrate, the SIP device including processor logic, a first memory and a memory controller to provide the processor logic with access to the first memory, and coupling a packaged device to the SIP device, the packaged device including a non-volatile memory, wherein coupling the packaged device to the SIP device includes coupling the memory controller to provide the processor logic with access to the non-volatile memory.

In an embodiment, the SIP device is coupled to provide a supply voltage to the packaged device. In another embodiment, interface hardware of the SIP device includes a first plurality of contacts having a first arrangement, the first plurality of contacts each to couple to the packaged device, and a second plurality of contacts having a second arrangement, wherein an interface standard describe an arrangement of interface contacts, wherein, of the first arrangement and the second arrangement, only the second arrangement conforms to the arrangement of interface contacts. In another embodiment, the first plurality of contacts are distributed among the second plurality of contacts. In another embodiment, the first arrangement corresponds to an arrangement of elements that the interface standard describes as reserved. In another embodiment, the SIP device is to couple with the packaged device in a package-on-package configuration. In another embodiment, the SIP device and the packaged device are coupled to one another via the substrate.

In another implementation, system comprises a substrate and a system-in-package (SIP) device coupled to the substrate, the SIP device including a package material and circuitry disposed in the package material, the circuitry including a processor, a first memory, and a memory controller including circuitry configured to provide the processor with access to the first memory. The SIP device further comprises interface hardware at an exterior of the package material. The system further comprises a packaged device coupled to the interface hardware of the SIP device, wherein the memory controller further to provide the host processor with access to a non-volatile memory of the packaged device.

In an embodiment, the interface hardware to provide a supply voltage to the packaged device. In another embodiment, interface hardware of the SIP device includes a first plurality of contacts having a first arrangement, the first plurality of contacts each to couple to the packaged device, and a second plurality of contacts having a second arrangement, wherein an interface standard describe an arrangement of interface contacts, wherein, of the first arrangement and the second arrangement, only the second arrangement conforms to the arrangement of interface contacts. In another embodiment, the first plurality of contacts are distributed among the second plurality of contacts. In another embodiment, the first arrangement corresponds to an arrangement of elements that the interface standard describes as reserved. In another embodiment, the SIP device is coupled with the packaged device in a package-on-package configuration. In another embodiment, the SIP device and the packaged device are coupled to one another via a substrate.

Techniques and architectures for accessing a solid state drive are described herein. In the above description, for purposes of explanation, numerous specific details are set forth in order to provide a thorough understanding of certain embodiments. It will be apparent, however, to one skilled in the art that certain embodiments can be practiced without these specific details. In other instances, structures and devices are shown in block diagram form in order to avoid obscuring the description.

Reference in the specification to "one embodiment" or "an embodiment" means that a particular feature, structure, or characteristic described in connection with the embodiment is included in at least one embodiment of the invention. The appearances of the phrase "in one embodiment" in various places in the specification are not necessarily all referring to the same embodiment.

Some portions of the detailed description herein are presented in terms of algorithms and symbolic representations of operations on data bits within a computer memory. These algorithmic descriptions and representations are the means used by those skilled in the computing arts to most effectively convey the substance of their work to others skilled in the art. An algorithm is here, and generally, conceived to be a self-consistent sequence of steps leading to a desired result. The steps are those requiring physical manipulations of physical quantities. Usually, though not necessarily, these quantities take the form of electrical or magnetic signals capable of being stored, transferred, combined, compared, and otherwise manipulated. It has proven convenient at times, principally for reasons of common usage, to refer to these signals as bits, values, elements, symbols, characters, terms, numbers, or the like.

It should be borne in mind, however, that all of these and similar terms are to be associated with the appropriate physical quantities and are merely convenient labels applied to these quantities. Unless specifically stated otherwise as apparent from the discussion herein, it is appreciated that throughout the description, discussions utilizing terms such as "processing" or "computing" or "calculating" or "determining" or "displaying" or the like, refer to the action and processes of a computer system, or similar electronic computing device, that manipulates and transforms data represented as physical (electronic) quantities within the computer system's registers and memories into other data similarly represented as physical quantities within the computer system memories or registers or other such information storage, transmission or display devices.

Certain embodiments also relate to apparatus for performing the operations herein. This apparatus may be specially constructed for the required purposes, or it may comprise a general purpose computer selectively activated or reconfigured by a computer program stored in the computer. Such a computer program may be stored in a computer readable storage medium, such as, but is not limited to, any type of disk including floppy disks, optical disks, CD-ROMs, and magnetic-optical disks, read-only memories (ROMs), random access memories (RAMs) such as dynamic RAM (DRAM), EPROMs, EEPROMs, magnetic or optical cards, or any type of media suitable for storing electronic instructions, and coupled to a computer system bus.

The algorithms and displays presented herein are not inherently related to any particular computer or other apparatus. Various general purpose systems may be used with programs in accordance with the teachings herein, or it may prove convenient to construct more specialized apparatus to perform the required method steps. The required structure for a variety of these systems will appear from the description herein. In addition, certain embodiments are not described with reference to any particular programming language. It will be appreciated that a variety of programming languages may be used to implement the teachings of such embodiments as described herein.

Besides what is described herein, various modifications may be made to the disclosed embodiments and implementations thereof without departing from their scope. Therefore, the illustrations and examples herein should be construed in an illustrative, and not a restrictive sense. The scope of the invention should be measured solely by reference to the claims that follow.

What is claimed is:

1. A system-in-package (SIP) device comprising:
   a package material;
   circuitry disposed in the package material, the circuitry including:
      a processor;
      a first memory; and
      a memory controller including circuitry to provide the processor with access to the first memory;
   interface hardware at an exterior of the package material, the interface hardware to couple the SIP device to a packaged device including a non-volatile memory, wherein, the memory controller is to provide the processor with access to the non-volatile memory while the SIP device is coupled to the packaged device.

2. The SIP device of claim 1, wherein the interface hardware to provide a supply voltage to the packaged device.

3. The SIP device of claim 1, wherein interface hardware of the SIP device includes:
   a first plurality of contacts having a first arrangement, the first plurality of contacts each to couple to the packaged device; and
   a second plurality of contacts having a second arrangement, wherein an interface standard describe an arrangement of interface contacts, wherein, of the first arrangement and the second arrangement, only the second arrangement conforms to the arrangement of interface contacts.

4. The SIP device of claim 3, wherein the first plurality of contacts are distributed among the second plurality of contacts.

5. The SIP device of claim 3, wherein the first arrangement corresponds to an arrangement of elements that the interface standard describes as reserved.

6. The SIP device of claim 1, wherein the SIP device to couple with the packaged device in a package-on-package configuration.

7. The SIP device of claim 1, wherein the SIP device to couple to the packaged device via a substrate.

8. A method comprising:
   providing a substrate of a hardware platform;
   coupling a system-in-package (SIP) device to the substrate, the SIP device including processor logic, a first memory and a memory controller to provide the processor logic with access to the first memory; and
   coupling a packaged device to the SIP device, the packaged device including a non-volatile memory, wherein coupling the packaged device to the SIP device includes coupling the memory controller to provide the processor logic with access to the non-volatile memory.

9. The method of claim 8, wherein the SIP device is coupled to provide a supply voltage to the packaged device.

10. The method of claim 8, wherein interface hardware of the SIP device includes:
    a first plurality of contacts having a first arrangement, the first plurality of contacts each to couple to the packaged device; and
    a second plurality of contacts having a second arrangement, wherein an interface standard describe an arrangement of interface contacts, wherein, of the first arrangement and the second arrangement, only the second arrangement conforms to the arrangement of interface contacts.

11. The method of claim 10, wherein the first plurality of contacts are distributed among the second plurality of contacts.

12. The method of claim 10, wherein the first arrangement corresponds to an arrangement of elements that the interface standard describes as reserved.

13. The method of claim 8, wherein the SIP device to couple with the packaged device in a package-on-package configuration.

14. The method of claim 8, wherein the SIP device and the packaged device are coupled to one another via the substrate.

15. A system comprising:
    a substrate;
    a system-in-package (SIP) device coupled to the substrate, the SIP device including:
       a package material;
       circuitry disposed in the package material, the circuitry including:
          a processor;
          a first memory; and
          a memory controller including circuitry to provide the processor with access to the first memory;
       interface hardware at an exterior of the package material; and
    a packaged device coupled to the interface hardware of the SIP device, wherein the memory controller is further to provide the processor with access to a non-volatile memory of the packaged device.

16. The system of claim 15, wherein the interface hardware to provide a supply voltage to the packaged device.

17. The system of claim 15, wherein interface hardware of the SIP device includes:
    a first plurality of contacts having a first arrangement, the first plurality of contacts each to couple to the packaged device; and
    a second plurality of contacts having a second arrangement, wherein an interface standard describe an arrangement of interface contacts, wherein, of the first arrangement and the second arrangement, only the second arrangement conforms to the arrangement of interface contacts.

18. The system of claim 17, wherein the first plurality of contacts are distributed among the second plurality of contacts.

19. The system of claim 15, wherein the SIP device to couple with the packaged device in a package-on-package configuration.

20. The system of claim 15, wherein the SIP device and the packaged device are coupled to one another via a substrate.

\* \* \* \* \*